US009030244B1

(12) United States Patent
Luo et al.

(10) Patent No.: US 9,030,244 B1
(45) Date of Patent: May 12, 2015

(54) CLOCK DUTY CYCLE CALIBRATION CIRCUITRY

(71) Applicant: Altera Corporation, San Jose, CA (US)

(72) Inventors: Mei Luo, San Jose, CA (US); Allen K. Chan, San Jose, CA (US); Thungoc M. Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/155,775

(22) Filed: Jan. 15, 2014

(51) Int. Cl.
*H03K 3/017* (2006.01)

(52) U.S. Cl.
CPC .................................. *H03K 3/017* (2013.01)

(58) Field of Classification Search
CPC ...................................................... H03K 3/017
USPC ......... 327/175, 262, 265, 269, 270, 273, 274, 327/279, 280, 286, 287, 291, 292, 295, 296, 327/297
See application file for complete search history.

(56) References Cited

U.S. PATENT DOCUMENTS

| 7,015,739 B2 * | 3/2006 | Lee et al. ....................... 327/175 |
| 7,705,647 B2 | 4/2010 | Dai et al. |
| 8,570,084 B2 | 10/2013 | Lin |
| 2011/0175657 A1 | 7/2011 | Chong et al. |

\* cited by examiner

*Primary Examiner* — Jung Kim (57) ABSTRACT

An integrated circuit includes a duty cycle detection circuit, a comparator circuit, and a tuning circuit. The duty cycle detection circuit receives a clock signal, such as a system clock signal, and detects the level of duty cycle distortion in the clock signal. The comparator circuit then generates an output based on the level of duty cycle distortion that is detected in the clock signal. The tuning circuit may accordingly adjust the clock signal based on the output generated by the comparator circuit to produce an adjusted clock output signal. As an example, the clock output signal produced by the tuning circuit after the adjustment may have a 50% (or significantly close to 50%) duty cycle.

17 Claims, 6 Drawing Sheets

CLOCK DUTY CYCLE CALIBRATION CIRCUITRY

BACKGROUND

Integrated circuit (IC) devices include circuits or logic elements that may be used to perform any of a variety of functions. Oftentimes, these devices are used in a larger system to perform complex functions. As an example, in a relatively complex system (e.g., a computer system, a communication system, etc.), multiple IC devices may communicate with one another to perform system functions.

Generally, such devices require a clock signal to operate. The clock signal synchronizes communication between two different devices (or between different circuit elements within a single IC device). Circuits that are designed to operate with a clock signal (commonly referred to as synchronous circuits) are generally activated at the rising or falling edge of the clock signal. Certain interfaces, such as the double data rate (DDR) memory interface, however, allow data transfer on both the rising and falling edges of the clock signal to achieve higher data transfer rates.

Generally, a clock signal is presented as a square wave and the duty cycle may refer to the percentage of clock period that the clock signal remains at a logic high (logic 1) or a logic low level (logic 0). As such, a clock signal that spends half its clock period at logic 1 and the other half at logic 0 is said to have a balanced duty cycle or a 50% duty cycle.

In applications such as double data rate systems, where both the rising and falling edges of the clock signal are used to sample data, it may be important for the clock signal to have a 50% duty cycle (or a duty cycle that is substantially close to that). Therefore, a 50% duty cycle (or a considerably balanced duty cycle) may be required for typical high speed or DDR applications. A clock signal with an unbalanced duty cycle may cause unwanted synchronization problems in the system. In DDR applications where data is sampled at both the rising and falling edges of the clock signal, duty cycle distortion may cause unwanted jitter as the period of time for data capture (either at the rising or falling edge of the clock signal) is reduced.

It is within this context that the embodiments described herein arise.

SUMMARY

Embodiments of the present invention include circuits and techniques for calibrating the duty cycle of a clock signal.

It is appreciated that the present invention can be implemented in numerous ways, such as a process, an apparatus, a system, or a device. Several inventive embodiments of the present invention are described below.

An integrated circuit may include a duty cycle detection circuit that receives a clock signal (e.g., a system clock generated within the integrated circuit). The duty cycle detection circuit may detect the level of duty cycle distortion in the received clock signal. A comparator circuit coupled to the duty cycle detection circuit may generate an output based on the level of duty cycle distortion in the clock signal. As an example, the comparator circuit may generate either a logic high or a logic low level depending on the level of duty cycle distortion in the clock signal. A tuning circuit may then adjust the clock signal based at least on the output generated by the comparator circuit to produce an adjusted clock output signal. The adjusted clock output signal may have a relatively balanced duty cycle (i.e., close to 50%).

Clock calibration circuitry may be used to calibrate a clock signal (e.g., by adjusting the duty cycle of the clock signal). The clock calibration circuitry may receive a pair of complementary clock input signals and may include a tuning circuit, a detection circuit, and a comparator circuit. The tuning circuit within the clock calibration circuitry outputs two clock output signals based on the pair of complementary clock input signals. The detection circuit may receive the two clock output signals generated by the tuning circuit. The detection circuit then generates two output signals based on the two clock output signals it receives. The comparator circuit accordingly compares the two output signals to output an incremental value based on the comparison. Accordingly, the tuning circuit adjusts the pair of complementary clock input signals based, at least in part, on the incremental value to produce the first and second clock output signals. The first and second clock output signals that are produced by the tuning circuit may have a 50% (or almost 50%) duty cycle.

A method of calibrating two clock signals includes setting an incremental value to a logic high level. In one instance, a comparator circuit may compare two complementary clock signals and output a logic high level based on the comparison. A calibration offset circuit may then accumulate the incremental value to output an accumulated calibration offset value. A tuning circuit may adjust the complementary clock signals based on the accumulated calibration offset value to produce a pair of adjusted clock signals.

DETAILED DESCRIPTION

The embodiments provided herein include circuitry and techniques to tune the duty cycle of a clock signal to reduce duty cycle distortion in an integrated circuit (IC).

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
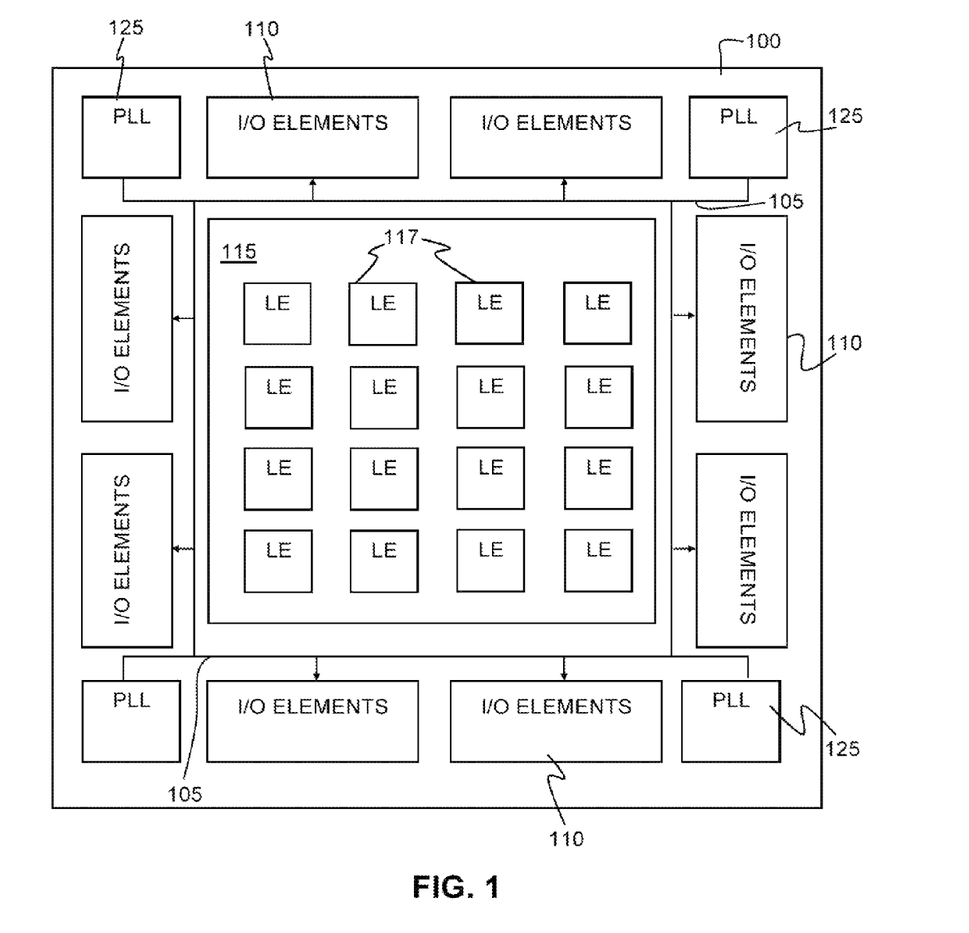
FIG. 1 is a simplified block diagram of an integrated circuit as one embodiment in accordance with the present invention.

FIG. 1, meant to be illustrative and not limiting, shows a simplified block diagram of IC 100 that can implement embodiments of the present invention. IC 100 includes core logic region 115 and input-output elements 110. Other auxiliary circuits, such as phase-locked loops (PLLs) 125 for clock generation and timing, can be located outside core logic region 115 (e.g., at corners of IC 100 and adjacent to input-output elements 110).

In the embodiment of FIG. 1, IC 100 includes clock network 105. It should be appreciated that clock network 105 may be used to transmit clock signals from clock circuits (e.g., PLLs 125) to various parts of IC 100. As an example, clock network 105 may be formed by different clock structures (not shown) that extend from different clock sources (e.g., PLLs 125) to different circuit elements or regions on IC 100 (e.g., input-output elements 110, core logic region 115).

Signals received from external circuitry at input-output elements 110 may be routed from input-output elements 110 to core logic region 115 or other logic blocks (not shown) on IC 100. Core logic region 115 may be populated with logic cells that may include "logic elements" (LEs) 117, among other circuits. In one embodiment, LEs 117 may include look-up table-based logic regions and may be grouped into "Logic Array Blocks" (LABs). LEs 117 and groups of LEs or LABs may be configured to perform specific user functions. Configuration data loaded into configuration memory (not shown) may be used to produce control signals that configure LEs 117 and groups of LEs and LABs to perform the desired user functions. Core logic region 115 may therefore perform logical functions based on the signals received.

Accordingly, signals may be sent from core logic region 115 and other relevant logic blocks of IC 100 to other external circuitry or components that may be connected to IC 100 through input-output elements 110. A single device like IC 100 can potentially support a variety of different interfaces and each individual input-output bank 110 may support a different input-output standard with a different interface or a different voltage level.

As an example, input-output elements 110 may include transceiver circuitry that includes a receiver circuit for receiving signals from an external component and a transmitter circuit for transmitting signals out of IC 100 to the external component using a double data rate (DDR) interface. As is generally known, DDR interfaces allow data transfer on both the rising and falling edges of a clock signal. As such, a balanced duty cycle (a 50% duty cycle or a duty cycle substantially close to that) may be required for most high speed applications that use a DDR interface.

Figure 2:
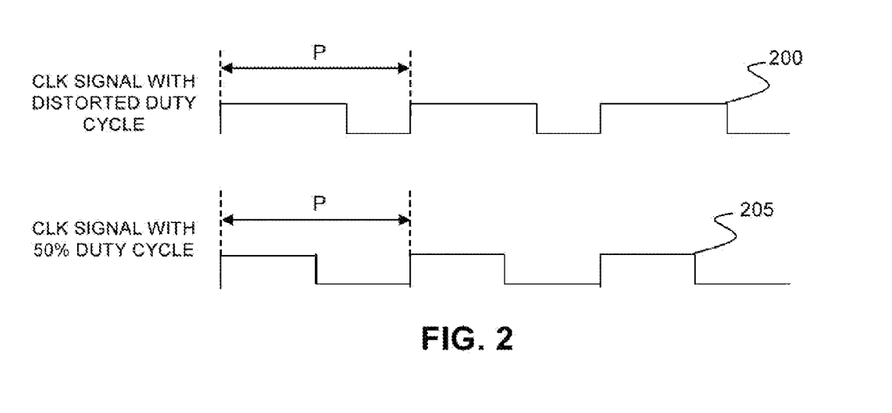
FIG. 2 shows an illustrative output waveform of a clock signal with an unbalanced duty cycle and an output waveform of a clock signal with a balanced duty cycle in accordance with embodiments of the present invention.

FIG. 2 shows illustrative output waveform 200 of a clock signal with an unbalanced duty cycle and output waveform 205 of a clock signal with a balanced duty cycle in accordance with embodiments of the present invention. As shown in FIG. 2, waveform 200 has unbalanced periods of logic high and logic low levels at every clock period, P. (It should be noted that a clock period refers to the period from one rising/falling edge to the next rising/falling edge of that clock signal.) At every clock period P in waveform 200, the clock signal with a distorted (unbalanced) duty cycle stays at the logic high level for a longer duration compared to the duration it stays at the logic low level. In alternative embodiments, the distorted clock signal can have a longer low level as compared to the high level, such that the distorted clock signal stays at the logic low level for a longer duration compared to the duration it stays in the logic high level.

Conversely, as shown by output waveform 205, a clock signal with a balanced duty cycle (or close to 50% duty cycle) stays at the logic high level for one half of its clock cycle and stays at the logic low level for the other half of its clock cycle. As a clock signal with a balanced duty cycle (as shown in output waveform 205) is typically preferred for high speed or DDR applications, calibration circuitry may be included in an IC device to adjust and correct any duty-cycle distortion in its clock signal.

Figure 3:
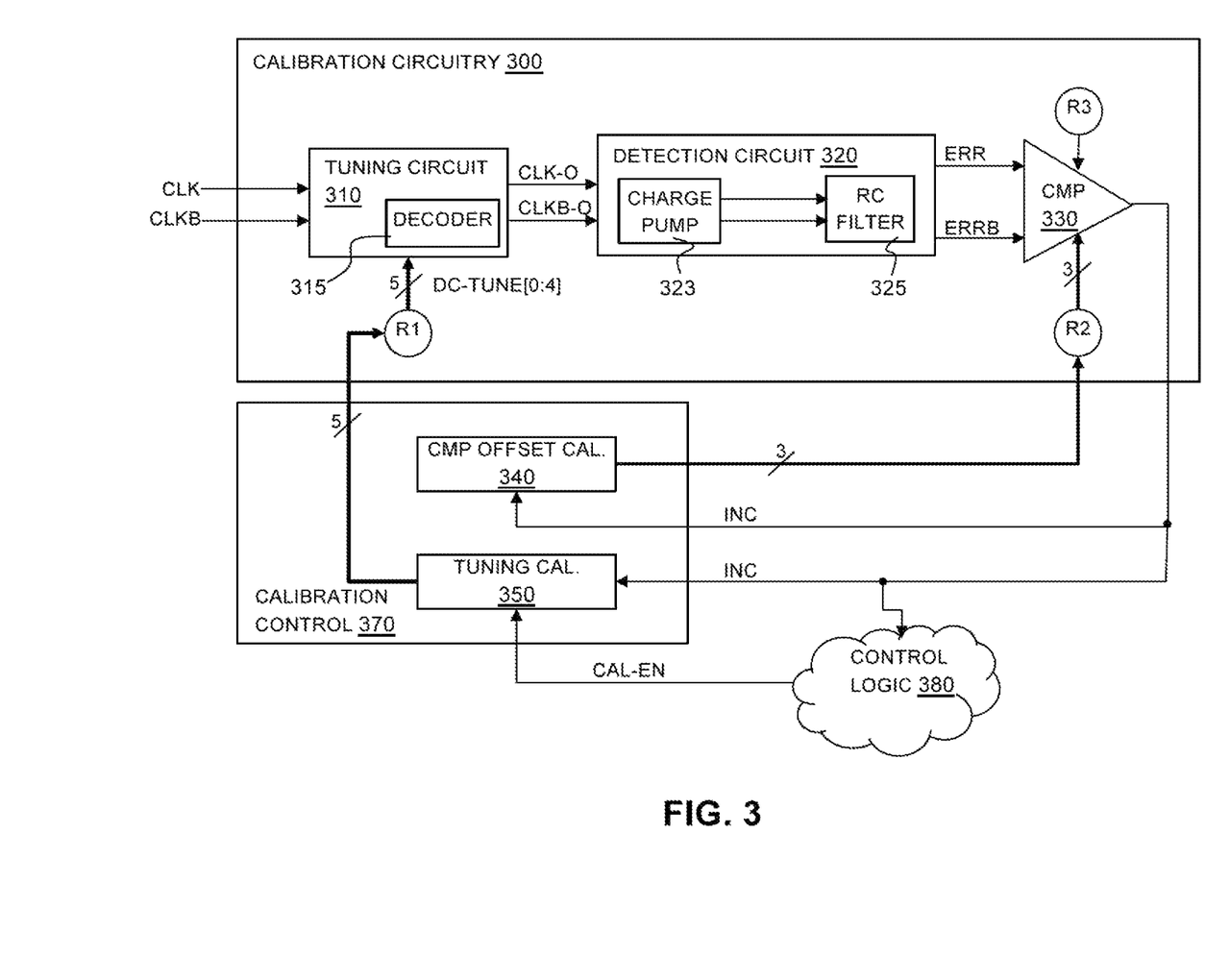
FIG. 3 shows illustrative calibration circuitry for calibrating duty cycles of clock signals in accordance with embodiments of the present invention.

FIG. 3 shows illustrative calibration circuitry 300 for calibrating duty cycles of clock signals in accordance with embodiments of the present invention. As mentioned above, the duty cycle of a clock signal may need to be adjusted for proper data capture, especially in high speed applications, and as such, calibration circuitry 300 may be used to tune the duty cycle of a clock signal in an IC device. As an example, calibration circuitry 300 may be used to adjust the duty cycle of a clock signal on a transmitter path (i.e., signal path in a transmitter circuit) on the IC device. In the embodiment of FIG. 3, calibration circuitry 300 includes tuning circuit 310, duty cycle detection circuit 320, and comparator circuit 330. Calibration control circuitry 370, which includes comparator offset circuit 340 and tuning calibration circuit 350, is coupled to calibration circuitry 300.

To calibrate a clock signal CLK, tuning circuit 310 receives the clock signal CLK, together with its complementary clock signal CLKB, and outputs a pair of adjusted output clock signals, CLK-O and CLKB-O. (The clock signals CLK and CLKB, and their respective adjusted output clock signals CLK-O and CLKB-O, may be 180 degrees out of phase with each other.) Tuning circuit 310 may be controlled by multiple calibration random access memory (RAM) bits R1. In one embodiment, at the first instance, the calibration RAM bits may be set to an initial default value (e.g., 00000) and the clock signals CLK and CLKB are skewed or adjusted to the smallest possible duty cycle (e.g., 43% duty cycle) at this stage. However, it should be noted that the default value may be set differently depending on the range of duty cycle variations in the clock signal CLK.

The clock signal CLK may be adjusted based on different values of the calibration RAM bits R1. In one instance, setting the calibration RAM bits R1 to 00000 adjusts or skews the clock signal CLK to the smallest possible duty cycle while setting the calibration RAM bits R1 to 10000 does not alter the duty cycle of the clock signal CLK. Accordingly, as the calibration RAM bits R1 is increased to 10001 (and up to 11111), the clock signal CLK may be adjusted or skewed to a larger duty cycle. As an example, if the clock signal CLK has a duty cycle of 50%, setting the calibration RAM bits R1 to 00000 may set the duty cycle of the clock signal CLK to 45%. The duty cycle of the clock signal may not be changed when the calibration RAM bits R1 is set to 10000. Accordingly, the duty cycle of the clock signal CLK may be adjusted to 55% when the calibration RAM bits R1 is set to 11111.

Detection circuit 320 receives the output clock signals CLK-O and CLKB-O and generates two output signals ERR and ERRB based on the clock signals CLK-O and CLKB-O. In one embodiment, detection circuit 320 includes charge pump 323 and resistor-capacitor (RC) filter 325 (details of which are not described herein in order to not unnecessarily obscure the present invention) that generates different voltage levels ERR and ERRB based on CLK-O and CLKB-O. The difference between ERR and ERRB represents the ratio of the duty cycle distortion in the clock signal CLK-O. Comparator circuit 330 (e.g., a voltage comparator) accordingly receives and compares the generated output signals or error values ERR and ERRB. Depending on the values of ERR and ERRB, comparator circuit 330 may set its output, INC, to either a logic high level or a logic low level.

The respective voltage levels of ERR and ERRB indicate whether the duty cycle of the clock signal CLK is greater or less than 50%. For example, when the duty cycle of the clock signal CLK is above 50%, ERR may be at a higher voltage level than ERRB and when the duty cycle is below 50%, ERR may be at a lower voltage level than ERRB. A clock signal with a balanced duty cycle (50% duty cycle) may produce equal ERR and ERRB values. Accordingly, in one example, comparator circuit 330 may be adapted to set INC to logic "1" when the duty cycle of the clock signal CLK is below 50% and sets INC to logic "0" when it is above 50%.

The output of comparator circuit 330, INC, is transmitted to tuning calibration circuit 350 in calibration control circuitry 370. Tuning calibration circuit 350 may accumulate the incremental value of INC to generate the calibration RAM bits R1. In the embodiment of FIG. 3, a total of five bits are used to set the calibration RAM bits R1. Tuning circuit 310 in turn calibrates the clock signal CLK and the CLKB clock signal based on the tuning bits DC-TUNE[0:4] from calibration RAM bits R1. As shown in FIG. 3, tuning circuit 310 includes decoder circuit 315. In one embodiment, tuning circuit 310 calibrates the duty cycle of the clock signals CLK and CLKB by adjusting the rise/fall of their respective slew rates based on the decoded tuning bits DC-TUNE[0:4]. As an example, the drive strength of an inverter chain in the tuning circuit may be increased or decreased by adding or removing the number of p-channel metal-oxide-semiconductor field-effect (PMOS) or n-channel metal-oxide-semiconductor field-effect (NMOS) transistor stages in the inverter chain.

Tuning circuit 310 outputs adjusted clock signals CLK-O and CLKB-O and the duty cycles of these clock signals are again measured by detection circuit 320. As explained above, detection circuit 320 generates voltage levels ERR and ERRB based on the duty cycles of the adjusted output clock signals CLK-O and CLKB-O. The voltage levels ERR and ERRB are compared by comparator circuit 330. If, for instance, the duty cycle of the adjusted output clock signal CLK-O is still below 50% (assuming at the very first instance, the duty cycle of the clock signal CLK is adjusted to below 50% and INC was set to a logic high level after the first cycle), comparator circuit 330 will continue to output a logic high level for INC and tuning calibration circuit 350 will output the accumulated incremental value INC and set calibration RAM bits R1 with the accumulated incremental value.

Tuning circuit 310 will calibrate or adjust the clock signals CLK and CLKB incrementally until the duty cycle of the adjusted output clock signals CLK-O and CLKB-O is balanced (or as close as possible to 50%). In one embodiment, the calibration stops when the output INC of comparator circuit 330 switches from a logic high level to a logic low level. As shown in FIG. 3, control logic 380 may be used to monitor the toggling of the output signal INC. Control logic 380 may output an asserted enable signal CAL-EN that enables tuning calibration circuit 350 in calibration control circuitry 370 to update calibration offset RAM bits R1. Accordingly, when INC toggles from the logic high level to the logic low level, indicating that the previous calibration made to the clock signal CLK (and clock signal CLKB) is as close as possible to a 50% duty cycle, control logic 380 may deassert CAL-EN. When CAL-EN is deasserted, tuning calibration circuit 350 may "lock" the calibration offset RAM bits R1 so that tuning circuit 310 may apply the appropriate offset value to the clock signals CLK and CLKB to produce the respective adjusted clock signals CLK-O and CLKB-O.

As shown in FIG. 3, calibration control circuitry 370 further includes comparator offset calibration circuit 340. As such, in one embodiment, the CAL-EN signal may also be used to enable and disable comparator offset calibration circuit 340. As an example, the CAL-EN signal may be deasserted before any calibration is performed on the input clock signals CLK and CLKB. In this scenario, tuning calibration circuit 350 is disabled while comparator offset circuit 340 is enabled. Accordingly, tuning calibration circuit 350 is not enabled (i.e., CAL-EN signal is deasserted) until comparator circuit 330 is calibrated.

Comparator circuit 330 may be controlled by RAM bits R2 and R3. In one embodiment, R3 may be a RAM control bit that enables and disables comparator circuit 330 for offset calibration. For example, R3 may store an asserted enable signal when comparator circuit 330 is placed in calibration mode. As shown in FIG. 3, three RAM bits R2 may be used to calibrate comparator circuit 330. The three-bit comparator offset value RAM bits R2 may be set by comparator offset calibration circuit 340. Comparator offset calibration circuit 340 outputs the three-bit comparator offset value based on the increment value INC from comparator circuit 330. When the increment value INC switches from one logic level to another (e.g., from 0 to 1), comparator offset calibration circuit 340 may be disabled so that the three-bit comparator offset value RAM bits R2 will not be updated (or the signal stored in R3 may be deasserted so that comparator circuit 330 will no longer be in calibration mode). In one embodiment, the calibration enable signal CAL-EN may be asserted at this point to enable tuning calibration circuit 350 and the duty cycle calibration operation may begin.

Figure 4:
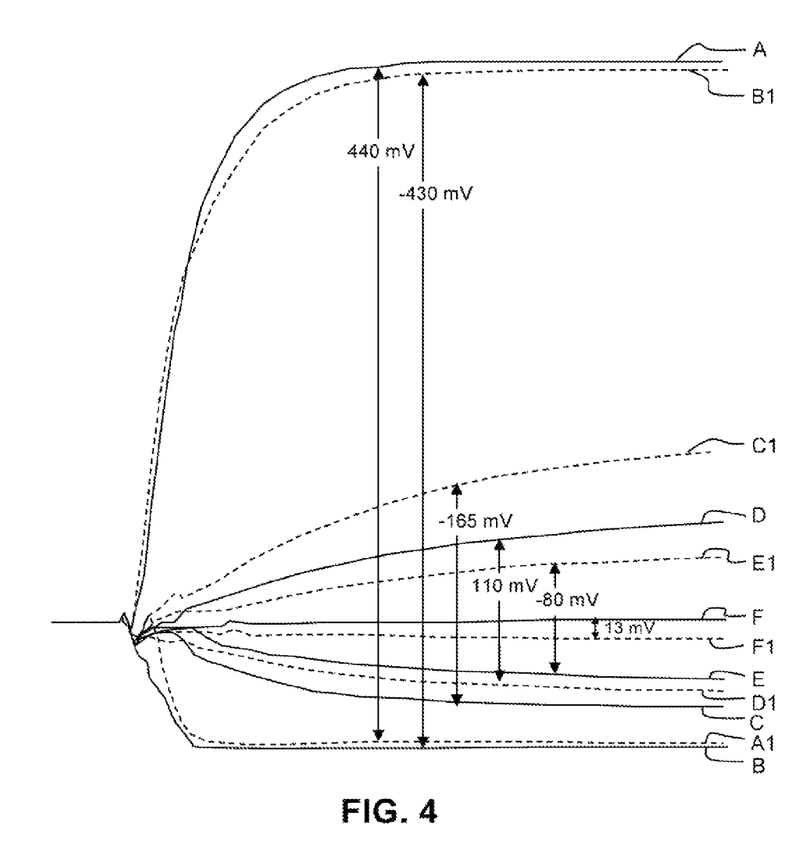
FIG. 4 shows exemplary output waveforms of two output signals from a duty cycle detection circuit in accordance with embodiments of the present invention.

FIG. 4 shows exemplary output waveforms of the ERR and ERRB signals from duty cycle detection circuit of FIG. 3 in accordance with embodiments of the present invention. The multiple ERR signals are represented by solid lines while the ERRB signals are represented by dotted lines. In one embodiment, the greater the difference (absolute difference) between ERR and ERRB, the larger the duty cycle distortion in that clock signal. In FIG. 4, for example, output waveforms A and A1 represent the voltage outputs ERR and ERRB for a clock signal with 61.9% duty cycle while output waveforms F and F1 represent the voltage outputs for a clock signal with 50.3% duty cycle.

In one embodiment, as explained above with reference to FIG. 3, as the duty cycle of the clock signal approaches 50%, the absolute difference between ERR and ERRB is reduced. It should be noted that in this example, ERR is greater than ERRB when the duty cycle is above 50% and ERRB is greater than ERR when the duty cycle is below 50%. In the example of FIG. 4, output waveforms A and A1 represent the voltage outputs for a clock signal with 61.9% duty cycle (ERR−ERRB=440 mV); output waveforms B and B1 represent the voltage outputs for a clock signal with 39.1% duty cycle (ERR−ERRB=−430 mV); output waveforms C and C1 represent the voltage outputs for a clock signal with 49% duty cycle (ERR−ERRB=−165 mV); output waveforms D and D1 represent the voltage outputs for a clock signal with 50.9% duty cycle (ERR−ERRB=110 mV); output waveforms E and E1 represent the voltage outputs for a clock signal with 49.6% duty cycle (ERR−ERRB=−80 mV); output waveforms F and F1 represent the voltage outputs for a clock signal with 50.3% duty cycle (ERR−ERRB=13 mV).

Figure 5:
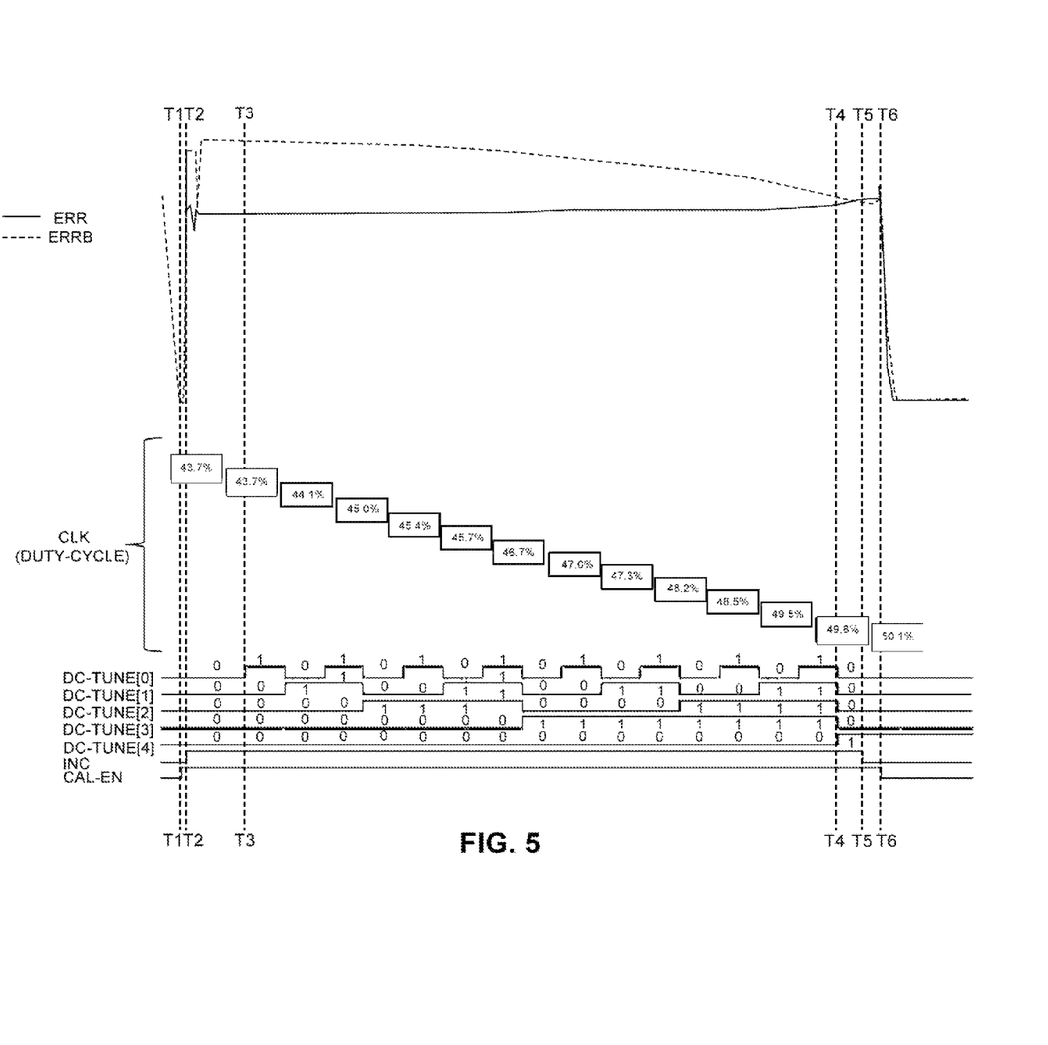
FIG. 5 shows illustrative output waveforms of various output signals as the duty cycle of an input clock signal is adjusted by calibration circuitry in accordance with embodiments of the present invention.

FIG. 5 shows illustrative output waveforms of the ERR and ERRB signals as the duty cycle of an input clock signal is adjusted by the tuning bits DC-TUNE[0:4] in accordance with embodiments of the present invention. It should be noted that FIG. 5 may be an output waveform of the duty cycle calibration shown in FIG. 3. In one embodiment, the tuning bits DC-TUNE[0:4] is initially set to 00000 and the duty cycle of the input clock signal may be skewed to the smallest possible duty cycle. In this example, the duty cycle begins at 43.7% (below 50%, so ERRB is greater than ERR). When the CAL-EN signal is asserted (e.g., set to a logic high level) at time T1, the INC signal is set to logic 1 at time T2, slightly after time T1.

As shown in FIG. 5, after the INC signal has been set to high, the tuning bits DC-TUNE[0:4] begins to count up. At time T3, the tuning bits DC-TUNE[0:4] switches from 00000 to 00001. At subsequent clock cycles, the tuning bits DC-TUNE[0:4] are incremented by 1 sequentially until they reach 10000 at time T4. As shown in FIG. 5, as the value of the tuning bits DC-TUNE[0:4] increases, the duty cycle of the clock signal CLK is adjusted towards 50%. Accordingly, as the duty cycle of the clock signal CLK approaches 50% the absolute difference between ERR (shown as a solid line) and ERRB (shown as a dotted line) decreases and approaches 0. As explained above, these adjustments may be made by tuning circuit 310 (shown in FIG. 3) based on the value of tuning bits DC-TUNE[0:4].

At time T5, the duty cycle of the CLK signal is at 50.1% (above 50%) and the value INC is toggle from logic 1 to logic 0. At time T6, based on the toggling of INC, the CAL-EN signal may be deasserted. In the example of FIG. 3, control logic 380 monitors the toggling of INC and may assert and deassert the CAL-EN signal as required. Once the CAL-EN signal is deasserted, the tuning bits DC-TUNE[0:4] will no longer be updated. As such, in this scenario, the duty cycle of the clock signal CLK may be adjusted by 10000 (the final value of tuning bits DC-TUNE[0:4]) and the duty cycle of the adjusted clock output signal is at 50.1% (or as close as possible to 50%).

Figure 6:
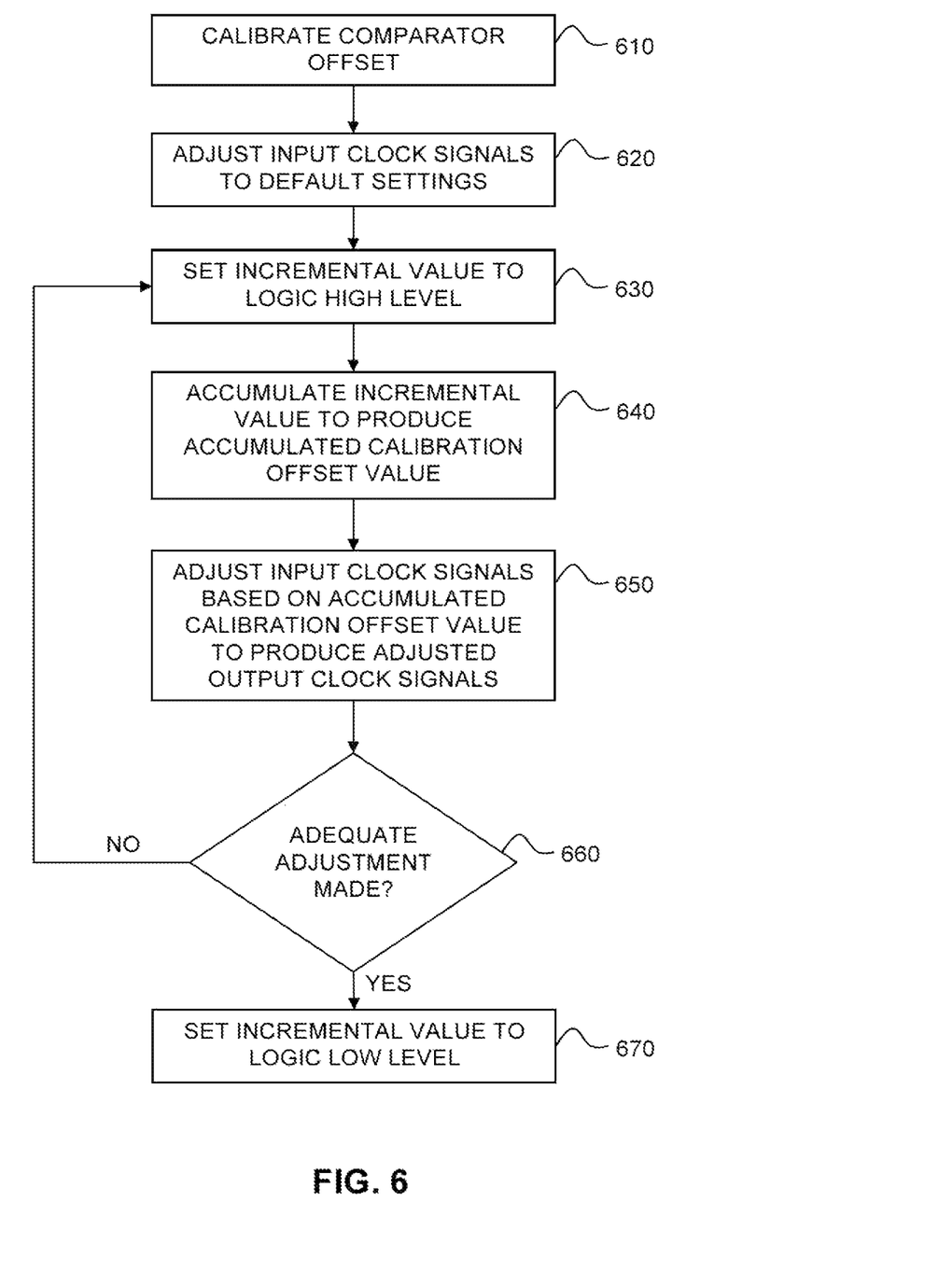
FIG. 6 shows steps for calibrating a pair of input clock signals with calibration circuitry in accordance with embodiments of the present invention.

FIG. 6 shows steps for calibrating a pair of input clock signals with calibration circuitry in accordance with embodiments of the present invention. The calibration circuitry may include a comparator circuit, a duty cycle detection circuit, and a tuning circuit. At step 610, the calibration circuitry calibrates the comparator circuit to cancel any offset in the comparator circuit. At step 620, the pair of input clock signals is adjusted to a default setting. In one embodiment, when the pair of input clock signals is a pair of complementary clock signals. Accordingly, in this scenario, when the input clock signals are adjusted to the default setting one of them may be skewed to a smallest possible duty cycle (below 50%) while another may be skewed to a largest possible duty cycle (above 50%). At step 630 an incremental value is set to high. As shown in the embodiment of FIG. 3, comparator circuit 330 outputs a logic high value as the incremental value when the duty cycle of the input clock signal CLK is below 50%.

At step 640, the tuning circuit accumulates the incremental value with a calibration offset circuit to produce an accumulated calibration offset value for the tuning circuit. The tuning circuit then adjusts the pair of input clock signals based on the accumulated calibration offset value to produce a pair of adjusted output clock signals at step 650. As shown in FIG. 3, tuning calibration circuit 350 accumulates the incremental value INC that it receives from comparator circuit 330 to produce multiple calibration RAM bits R1. The calibration RAM bits R1 is supplied to tuning circuit 310 as tuning bits DC-TUNE[0:4]. Tuning circuit 310 in turn tunes the input clock signal CLK and a complementary clock signal CLKB based on the tuning bits DC-TUNE[0:4] to produce an adjusted clock signal CLK-O together with an adjusted complementary clock signal CLKB-O.

At step 660 the detection circuit may determine if the adjusted output clock signals have been adequately adjusted. In one scenario, as mentioned above, the input clock signals may be complementary clock signals. As explained, at step 620, the duty cycle the input clock signal (e.g., CLK of FIG. 3) may be adjusted to below 50% while the duty cycle of the complementary input clock signal (e.g., CLKB of FIG. 3) may be adjusted to above 50%. If, after the adjustment made by the tuning circuit at step 650, the duty cycle of the input clock signal exceeds 50% (or the duty cycle of the complementary input clock signal drops below 50%), at step 660, the detection circuit may determine that adequate adjustment has been made to the input clock signal. Accordingly, the incremental value is set to a logic low value at step 670. If the detection circuit determines at step 660 that the adjustment made was inadequate, the incremental value is again set to a logic high level at step 630 and the subsequent steps 640-660 are repeated until the clock signals have been adjusted adequately.

As explained above with reference to FIG. 3, logic control circuit 380 may deassert an enable signal CAL-EN to disable tuning calibration circuit 350 when the incremental value INC toggles from one logic level to another (e.g., from a logic high level to a logic low level). At this stage, the calibration circuitry may stop calibration and the tuning circuit may accordingly adjust the clock input signals based on the final accumulated calibration offset value. The produced clock output signals may thus have a 50% (or close to 50%) duty cycle.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit comprising:
   a duty cycle detection circuit that detects level of duty cycle distortion in a received clock signal;
   a comparator circuit that generates an output based on the level of duty cycle distortion in the received clock signal;
   a tuning circuit that adjusts the received clock signal based at least in part on the output generated by the comparator circuit and a plurality of calibration bits to produce an adjusted clock output signal; and
   logic circuitry that generates a calibration enable signal based on the output from the comparator circuit, wherein the plurality of calibration bits are updated only when the calibration enable signal is asserted.

2. The integrated circuit defined in claim 1 further comprising:
   a tuning calibration circuit that receives the output from the comparator circuit and the calibration enable signal from the logic circuitry, wherein the tuning calibration circuit updates the plurality of calibration bits based on the output.

3. The integrated circuit defined in claim 1, wherein the tuning circuit receives the plurality of calibration bits and adjusts the received clock signal based on the plurality of calibration bits.

4. The integrated circuit defined in claim 1, wherein the output from the comparator circuit toggles from one logic level to another based on the adjusted clock output signal, and wherein the asserted calibration enable signal is deasserted in response to the toggling of the output.

5. The integrated circuit defined in claim 1, wherein the duty cycle detection circuit generates a first error value based on the level of duty cycle distortion in the received clock signal and further generates a second error value based on level of duty cycle distortion in an additional clock signal that is 180 degrees out of phase with the received clock signal.

6. The integrated circuit defined in claim 5, wherein the comparator circuit comprises a voltage comparator, wherein the first and second error values comprise first and second voltage levels, respectively, wherein the comparator circuit compares the first voltage level with the second voltage level, and wherein the comparator circuit generates the output based on a result of the comparison.

7. Clock calibration circuitry that receives a pair of complementary clock input signals, comprising:
   a tuning circuit that receives the pair of complementary clock input signals and that outputs first and second clock output signals based on the pair of complementary clock input signals;
   a detection circuit that receives the first and second clock output signals and that generates first and second output signals based on the first and second clock output signals, respectively;
   a comparator circuit that compares the first output signal with the second output signal and that outputs an incremental value based on the comparison, wherein the tuning circuit adjusts the pair of complementary clock input signals based at least in part on the incremental value to produce the first and second clock output signals; and
   an offset computation circuit that produces an offset value for the comparator circuit based at least in part on the incremental value.

8. The clock calibration circuitry defined in claim 7 further comprising:
   a tuning calibration circuit that accumulates the incremental value and that outputs a plurality of calibration bits based on the accumulated incremental value.

9. The clock calibration circuitry defined in claim 8 further comprising:
   logic circuitry that generates an asserted enable signal based on the incremental value from the comparator circuit, wherein the tuning calibration circuit accumulates the incremental value in response to the assertion of the enable signal.

10. The clock calibration circuitry defined in claim 8, wherein the tuning circuit receives the plurality of calibration bits and adjusts the pair of complementary clock input signals based at least in part on the plurality of calibration bits.

11. The clock calibration circuitry defined in claim 7, wherein the offset computation circuit updates a plurality of random access memory (RAM) bits with the offset value, and wherein the plurality of RAM bits is used to tune the comparator circuit.

12. The clock calibration circuitry defined in claim 7, wherein the tuning circuit comprises a 5-to-32 decoder circuit.

13. An integrated circuit, comprising:
   a tuning circuit that receives a clock signal having a duty cycle and that generates a corresponding output clock signal;
   a duty cycle detection circuit that generates first and second error signals based on the duty cycle of the clock signal;
   a comparator circuit that receives the first and second error signals and generates an increment signal that indicates when the first error signal exceeds the second error signal and that also indicates when the second error signal exceeds the first error signal;
   calibration control circuitry that receives the increment signal and increments a control signal for controlling the tuning circuit when the first error signal exceeds the second error signal and stops incrementing the control signal when the second error signal exceeds the first error signal; and
   control logic that monitors the first and second error signals and that selectively enables the calibration control circuitry to adjust the tuning circuit.

14. The integrated circuit defined in claim 13, wherein the comparator circuit is interposed between the duty cycle detection circuit and the calibration control circuitry.

15. The integrated circuit defined in claim 13, wherein the calibration control circuitry is configured to dynamically adjust the tuning circuit so that the output clock signal exhibits a desired duty cycle.

16. The integrated circuit defined in claim 13, wherein the calibration control circuitry is further configured to perform comparator offset calibration on the comparator circuit.

17. The integrated circuit defined in claim 13, further comprising:
   configuration memory elements having an input that is coupled to the calibration control circuitry and an output that is coupled to the tuning circuit.

* * * * *